United States Patent
Colelli, Jr. et al.

[11] Patent Number: 6,100,506
[45] Date of Patent: Aug. 8, 2000

[54] HOT PLATE WITH IN SITU SURFACE TEMPERATURE ADJUSTMENT

[75] Inventors: James J. Colelli, Jr., Jericho; Randall A. Leggett, Milton, both of Vt.; Joseph Mundenar, Eden Prairie, Minn.; Charles A. Whiting, Milton, Vt.

[73] Assignee: International Business Machines Corporation, Armonk, N.Y.

[21] Appl. No.: 09/361,451

[22] Filed: Jul. 26, 1999

[51] Int. Cl.[7] .............................. H05B 3/68; C23C 16/00
[52] U.S. Cl. ....................... 219/446.1; 118/725
[58] Field of Search ............................ 219/443.1, 444.1, 219/448.11, 409, 411, 413, 502; 118/725, 726, 621, 624; 427/8, 9, 10, 592

[56] References Cited

U.S. PATENT DOCUMENTS

| | | | |
|---|---|---|---|
| 4,918,291 | 4/1990 | Higgins et al. . | |
| 5,099,120 | 3/1992 | Turnbull | 250/338.2 |
| 5,155,337 | 10/1992 | Sorrell et al. | 219/413 |
| 5,196,353 | 3/1993 | Sandhu et al. | 438/5 |
| 5,280,156 | 1/1994 | Niori et al. | 118/725 |
| 5,294,778 | 3/1994 | Carman et al. . | |
| 5,377,126 | 12/1994 | Flik et al. | 364/557 |
| 5,396,047 | 3/1995 | Schilling et al. . | |
| 5,702,624 | 12/1997 | Liao et al. . | |
| 5,809,211 | 9/1998 | Anderson et al. | 118/725 |
| 5,831,249 | 11/1998 | Rohner et al. | 219/413 |

*Primary Examiner*—Sang Paik
*Attorney, Agent, or Firm*—Scully, Scott, Murphy & Presser; William D. Sabo, Esq.

[57] ABSTRACT

An arrangement and method for controlling individual zones of a hot plate which is employed in a post exposure bake step of wafers in the fabrication of semi-conductor devices incorporating photolithographic processes using chemically amplified resist systems. Provided is an in situ temperature-controllable hot plate which includes temperature-controllable surface zones for supporting a standard single wafer, and having loading means which orient the wafer on the hot plate. The hot plate may be segmented into an array of individually controllable heating zones, while mounted above the hot plate is a thermal detection array, such as an infrared(IR) camera or pyroelectric or pyrometric detector which functions to detect and scrutinize the wafer surface temperature with regard to specific locations dispersed across the hot plate surface. This particular data is mapped into the hot plate zones, and the mapped data transmitted into a servo for zonal hot plate adjustment and temperature control.

18 Claims, 1 Drawing Sheet

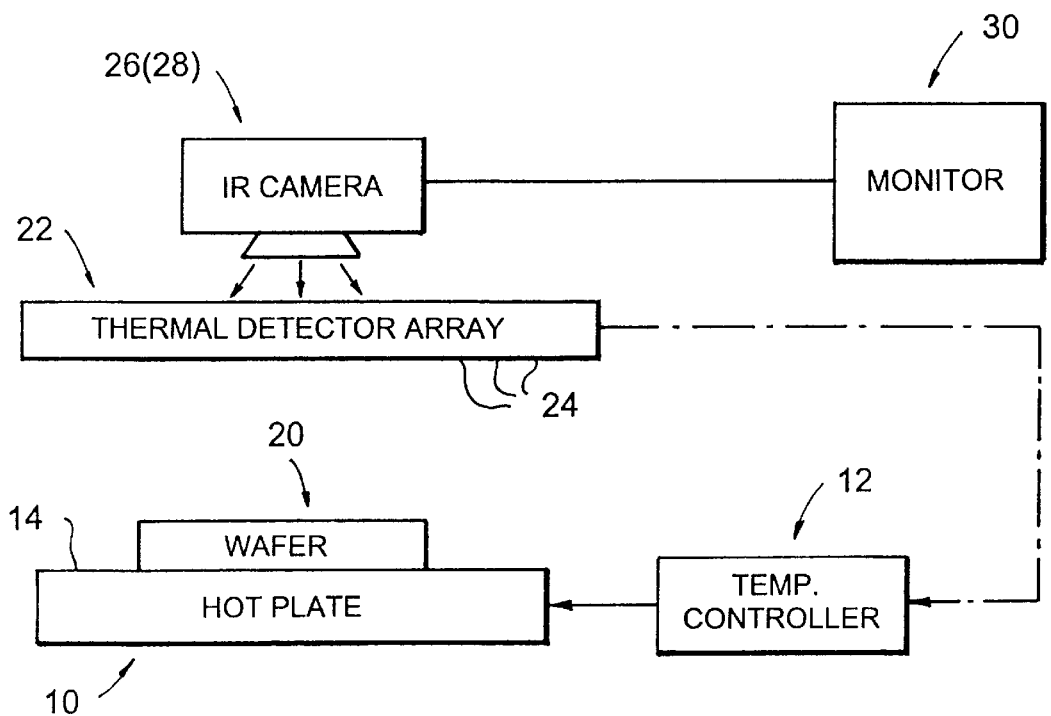
FIG. 1
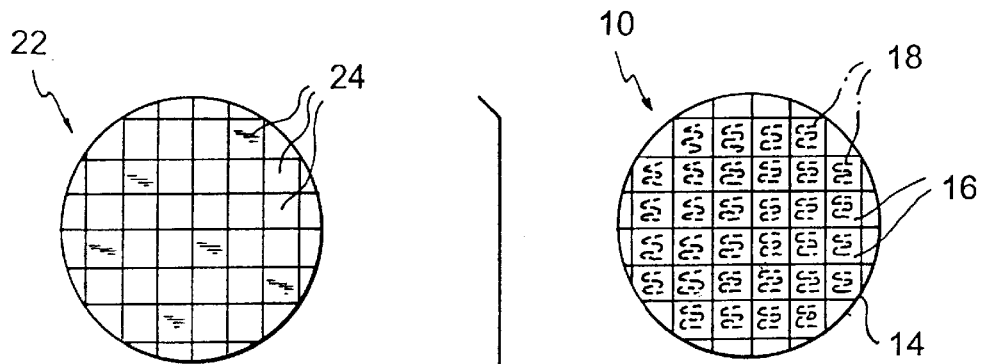
1. SPOT DETECTION
2. TEMP.
3. OUTPUT - SPC
4. CALIBRATION
5. OPTICAL UNIFORMITY FEEDBACK
FIG. 3
FIG. 2

HOT PLATE WITH IN SITU SURFACE TEMPERATURE ADJUSTMENT

BACKGROUND OF THE INVENTION

1. Field of the Invention

The present invention relates to an arrangement for controlling individual zones of a hot plate which is employed in the fabrication of semi-conductor devices.

In present installations, hot plate temperature control is generally based upon a relatively small number of sensors; for instance, normally about two sensors, which are buried within the hot plate, and no measures are provided which will enable to locally correct or adjust the temperature of the hot plate at a single sensor. Consequently, when the encountered degree of temperature uniformity deviates so as to be out of bounds of the required specification, the airflow within the enclosed hot plate environment may be tuned or modified as necessary in order to achieve an improved hot plate surface temperature uniformity. Moreover, a test wafer used in photolithographic processes having thermocouples and wire connections may be utilized to test hot plate surface temperatures and compare these with a standard; however, the wire connections tend to impact normal airflow, and resultingly it is not readily possible to achieve an ideal or true indication of hot plate surface or surface zone temperatures and uniformity across the surface of the hot plate.

2. Discussion of the Prior Art

Various publications are known with regard to different aspects directed to the controlling of the surface temperatures of hot plates, such as are used in the production of integrated circuit devices.

Schilling, et al., U.S. Pat. No. 5,396,047 discloses an electrical heating unit having peripherally extending surface areas with a plurality of radially spaced heating coils which are alternately heated. The heating coils have heat sensors embedded therein in order to provide a thermal profile which will facilitate switching over of the heating between the peripheral or annular heat coils in order to achieve a predetermined temperature pattern across the surface areas of the heating unit.

Carman, et al., U.S. Pat. No. 5,294,778 pertains to a wafer support platen incorporating a heating system for low pressure chemical vapor deposition, and wherein a plurality of circumferentially arranged resistance heaters incorporate sensors for an indication of specific temperatures at spots or point locations which are distributed across the surface of the hot plate. Responsive to predetermined temperature requirements or temperature deviations, as may be the specific case, an appropriate electrical current may be imparted to the various resistance heaters through the intermediary of a temperature controller to provide the desired surface temperature for the hot plate which is employed for the support of a wafer for an integrated circuit device.

Higgins, et al., U.S. Pat. No. 4,918,291 discloses an electrical heater assembly construction including a glass ceramic top cooking plate in which embedded electrical heating elements are adapted to have their temperatures regulated through the intermediary of a suitable temperature controller system. The different electrical power supply levels for the heating elements can be controlled by an energy regulator or an electronic phase control.

Liao, et al., U.S. Pat. No. 5,702,624 pertains to a hot plate temperature control system for the heat treatment of wafers having integrated circuits thereon through the curing of photoresist which is deposited on a semiconductor substrate. Suitable thermocouples may be arranged in physical connection with a hot plate supporting the wafers so as to sense variations in the temperatures within particular hot plates surface zones, enabling a power monitor and controller to regulate the temperatures in order to achieve desired temperature conditions within the hot plate and across the various surface zones thereof, as may be required by specified production conditions.

IBM Technical Disclosure Bulletin, Vol. 34, No. 5, October 1991, pgs. 350 through 353, describes wavelength modulated interferometric thermometry for the measurement of non-monotonic temperature changes. Although this particular publication of the present assignee relates to the use of an interferometric temperature measurement system for the control of wafer heating, with sensors and feed-back to a controller and temperature monitor, there is no disclosure of the inventive hot plate structure with in situ surface temperature adjustment as described hereinbelow.

SUMMARY OF THE INVENTION

The necessity for being able to control or modulate the temperatures of a hot plate supporting various zones of the wafers employed in photolithographic processes pertaining to the fabrication of semiconductor devices in which the postexposure bake temperatures can significantly change resultant device image size is well known in the technology.

It is also widely known in this technology that a modulation in post exposure bake temperatures to which the wafers are subjected may readily change the resultant device image sizes by potentially about 10–20 nm per degree C.

Thus, current process sequences for the defining of integrated circuit (IC) patterns on wafers, through the utilization of chemically amplified resist systems, essentially incorporate the following steps: applying resist to the wafer surface; baking on a hot plate in order to drive off or vaporize solvents; expose; post exposure bake to controllably amplify the resist chemical reaction which then results in diffusion of the acid catalyzed reaction, thereby defining a prescribed line width for the integrated circuit patterns; and then to develop the foregoing in a final process step.

Generally, the post exposure bake step is performed on a large-surfaced hot plate wherein the temperature across the hot plate is variable, producing temperature deviations across the wafer and causing chip linewidth variations across the wafer expanse. This linewidth variation becomes particularly problematic for integrated circuit poly-gate levels and results in device speed variations.

In particular, pursuant to the present invention, there is utilized an in situ closed loop real-time hot plate surface temperature monitoring system which also includes a characterization and adjustment system for controlling the hot plate surface temperature across various zones thereof. The inventive system or arrangement comprises the positioning of an infrared camera or pyrometer for effectuating visual thermal measurement above a wafer carrying an integrated circuit which is positioned on the hot plate, and wherein the infrared camera or pyrometer continuously scans and reads the temperature reigning across the surface of the wafer.

In essence, heating elements of the hot plate are grouped into individually adjustable heating zones, and wherein infrared camera or pyrometer temperature readings which are obtained by the infrared camera or pyrometer/pyroelectric device positioned located above the surface of the hot plate supporting the wafer, are digitized, analyzed and transmitted to a hot plate controller which is adapted to individually adjust the various heating zones of the hot plate surface in order to provide for control over an uniformity in the temperature extending across the hot plate surface. Moreover, the invention renders it possible to regulate the temperatures of the individual zones extending across the zones of the hot plate by utilizing the infrared camera or pyrometer contactless temperature readings for transmitting the applicable information to the hot plate controller so as to provide individualized adjustment of heating zone temperatures across the hot plate surface. This, in essence, eliminates the need for utilizing embedded sensors in the hot plate or thermocouples which have a tendency to frequently fail in providing an adequate degree of spatial resolution and precision in implementing the surface temperature control of the hot plate in conformity with the specific requirements for regulating the temperature variations within predetermined parameters; possibly within a temperature differential or delta ($\Delta T$) of about 0.3 degrees C across the wafer.

Accordingly, the invention may be directed to the provision of an in situ temperature-controllable hot plate which includes temperature-controllable surface zones for supporting a standard single wafer, and having loading means which orient the wafer on the hot plate. The hot plate may be segmented into an array of individually controllable heating zones, while mounted above the hot plate is a thermal detection array, such as an infrared(IR) camera or pyroelectric or pyrometric detector which functions to detect and scan the wafer surface temperature with regard to specific locations dispersed across the hot plate surface. This particular data is mapped into the hot plate zones, and the mapped data transmitted into a servo for zonal hot plate adjustment and temperature control (utilizing existing infrared detection array equipment).

Optionally, a monitor may be connected to the hot plate for in situ visual monitoring of the surface temperature thereof relative to each zone so as to ensure that the hot plate monitoring system is controlling the temperature to a desired overall surface temperature profile.

In essence, data from this thermal detection array is employed to ascertain or understand spot temperature detection, temperature delta ($\Delta t$) or variation across the wafer surface or wafer surface zones, process control, calibration and uniformity. Moreover, the data may be stored in a memory storage in order to provide an improved understanding of subsequently measured integrated circuit linewidth data, and which may then be employed as standards for subsequent production processes.

Accordingly, it is an object of the present invention to provide a temperature control arrangement or system for hot plates supporting a wafer for the production of integrated circuits.

Another object of the present invention is to provide an arrangement for an improved control over temperatures ranging across zones of a hot plate mounting a wafer utilized in the forming of integrated circuits thereon.

Yet another object of the present invention is to provide a hot plate temperature control arrangement or system incorporating novel means for the measurement of temperatures and temperature changes ranging across zones of the hot plate supporting a wafer, wherein the temperatures may be adjusted through the intermediary of a temperature controller responsive to temperatures which are sensed through the intermediary of temperature sensing means which are located above the wafer.

A still further object of the present invention relates to the provision of a temperature controlling arrangement of the type described, in which the temperature sensing means may consist of infrared camera structure or a pyrometer incorporating an array of sensors for the scrutinizing measurement of temperature over the surface expanse of a wafer and providing means for control over the temperature of a hot plate responsive to the sensors for resultingly controlling the wafer temperatures.

A still further object of the invention resides in the provision of an arrangement of the type described, wherein the means for sensing the temperature over surface zones of a wafer may be implemented through pyroelectric or pyrometer structure for controlling a temperature regulator so as to adjust the temperatures of various individual zones of a hot plate mounting the wafer to specific degrees of uniformity.

BRIEF DESCRIPTION OF THE DRAWINGS

Reference may now be had to the following detailed description of preferred embodiments of the invention, taken in conjunction with the accompanying drawings; in which:

FIG. 1 illustrates, generally diagrammatically, a system and arrangement for the sensing wafer temperatures and controlling in situ hot plate surface temperatures of a hot plate supporting the wafer and resultingly controlling the temperature of the wafer supported thereon;

FIG. 2 illustrates a bottom plan view of the infrared camera of FIG. 1 showing the array of detectors for sensing the temperatures ranging across the surface of the wafer; and FIG. 3 illustrates a bottom plan view of the hot plate illustrating heating coils embedded therein adapted to provide temperature regulation for various hot plate zones and the wafer surface responsive to sensed wafer surface temperatures.

DETAILED DESCRIPTION OF THE PREFERRED EMBODIMENTS

Referring in detail to the drawings, and particularly to FIG. 1, there is illustrated a hot plate 10 which is connected to a controller 12 for adjusting the temperature of at least the upper surface 14 of the hot plate 10.

As illustrated in FIG. 3 of the drawings, the hot plate 10 may be divided into a plurality of zones 16 on surface 14, for example, such as into surface squares; each having heating filaments or elements 18 embedded therein, which in response to the temperature controller 12, may provide for either a uniformly heated hot plate surface 14 or an adjustment of the individual zones 16 of the surface in accordance with specific conditions, as referred to hereinbelow.

Arranged on the hot plate 10 in a predetermined adjusted position is a wafer 20 utilized for the production of semiconductor devices having integrated circuits formed on the upper surface of the wafer, and wherein loading structure (not shown) is adapted to orient the wafer 20 on the surface 14 of the hot plate 10. In essence, the hot plate 10 may be designed so as to support a single standard wafer 20, although it is conceivable that a large-sized hot plate may be employed for simultaneously controlling the temperature of a plurality of predeterminedly spaced wafers thereon.

Positioned at a spaced relationship above the wafer is an array 22 of thermal detectors 24 which are acted upon by either an infrared camera 26 or a pyroelectric or pyrothermal component 28 for detecting the surface temperature of the wafer 10 in correlation with a particular location relative to the thermal detection array located thereabove.

The infrared camera 26 or pyroelectric or pyrothermal component 28 is adapted to map the obtained temperature data from the upper surface 14 of the wafer 20 into the hot plate zones 16 relative to the position of the wafer 20 thereon, and to convey this mapped data to a suitable servo system for adjusting and controlling the temperature of the hot plate surface 14 or more particularly the individual hot plate zones 16 as shown in FIG. 3.

The foregoing data may also be transmitted into an optionally provided monitor 30 which will enable the implementation of spot detection of temperatures, the temperature differentials or deltas (Δt) extending across the wafer surface or zones, process control, calibration in uniformity including or correlation with previously mapped standard temperature data. This monitor and the servo system is more closely elucidated in the specification of commonly assigned copending application Ser. No. 09/314,368 (Attorney Docket: 12236; BU998-222), the disclosure of which is incorporated herein by reference.

The spot detection is provided for by the temperature detector array 22, as shown in FIG. 2, which is arranged below the infrared camera 26 or the pyroelectric component 28, provides all of the temperature information in correlation with the individual zones 16 on the hot plate 10 on which the wafer 20 is positioned.

Thus, the foregoing enables the monitor 30 and the servo system to provide for in situ visual monitoring of the temperature ranging across the surface of the wafer 20 versus the hot plate surface zones 16 so as to ensure that the hot plate heating system is thermally controlling the wafer 20 to the desired temperature profile which, in turn, will provide for the appropriate linewidths for the integrated circuits being processed in a photolithographic process, during the post exposure baking step, thereby providing a fine or precise degree of control over the resultant device image sizes for the integrated circuit patterns.

The foregoing components, such as the temperature detecting array 22 and the infrared camera 26 or the pyroelectric or pyrothermal component 28 may be of basically standard or well known construction. Furthermore, there is no necessity for providing additional expensive and complicated equipment in order to achieve the desired temperature control over the wafer surface by means of regulating the temperatures in the various zones 16 arranged across the surface 14 of the hot plate 10 through the intermediary of the hot plate temperature controller 12.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. An arrangement for controlling the temperature of a hotplate used for spatially adjusting and controlling the temperature of at least an upper surface of a wafer for the fabrication of semiconductor structures; said arrangement, comprising:

(a) means for supplying energy to said hotplate for heating said hot plate;

(b) controller means for modulating the supply of energy to said hotplate so as to regulate the temperature of the hotplate surface supporting said wafer;

(c) means for sensing the temperature of said wafer, said sensing means including a thermal detection array arranged above the upper surface of said wafer for scrutinizing the temperatures across a plurality of zones across the surface of said wafer; and (d) means for processing temperature information received from said energy supply responsive to temperature deviations sensed from said wafer so as to correctively adjust the temperature of said hotplate and resultingly of said wafer to a specified uniform surface wafer temperature profile.

2. An arrangement as claimed in claim 1, wherein said sensing means comprises an infrared camera arranged in spaced relationship above said wafer.

3. An arrangement as claimed in claim 1, wherein said sensing means comprises a pyrometric element arranged in spaced relationship above said wafer.

4. An arrangement as claimed in claim 1, wherein said energy supply is transmitted to said hot plate so as to uniformly heat the surface of said hot plate supporting said wafer.

5. An arrangement as claimed in claim 1, wherein said hot plate has a surface for supporting said wafer divided into a plurality of zones, said energy being supplied to heating elements in each of said zones so as to impart a predetermined heating pattern to the surface of said hot plate.

6. An arrangement as claimed in claim 5, wherein said zones in said hot plate comprise individually thermally-controllable heating areas in the surface of said hot plate.

7. An arrangement as claimed in claim 6, wherein said zones are heated in correlation with temperatures sensed on said wafer so as to adjust the hot plate temperatures to a specified temperature profile.

8. An arrangement as claimed in claim 1, wherein said wafer temperature is controlled during post exposure baking of the wafer employed in the fabrication of semiconductor devices and to control the image sizes of integrated circuits on said wafer.

9. An arrangement as claimed in claim 1, wherein a monitor is operatively connected to said hot plate for in situ visual monitoring of hot plate surface temperatures so as to ensure that the hot plate arrangement is controlled to the specified temperature profile.

10. A method for controlling the temperature of a hotplate used for spatially adjusting and controlling the temperature of at least an upper surface of a wafer for the fabrication of semiconductor structures; said method comprising:

(a) supplying energy to said hotplate for heating said hotplate;

(b) modulating the supply of energy to said hotplate so as to regulate the temperature of the hotplate surface supporting said wafer;

(c) sensing the temperature of said wafer, said sensing including utilizing a thermal detection array arranged above the upper surface of said wafer for scrutinizing the temperature across a plurality of zones across the surface of said wafer and;

(d) processing temperature information received from said energy supply responsive to temperature deviation sensed from said wafer so as to correctively adjust the temperature of said hotplate and resultingly of said wafer to a specified uniform surface wafer temperature profile.

11. A method as claimed in claim 10, wherein said sensing comprises arranging an infrared camera in spaced relationship above said wafer.

12. A method as claimed in claim 10, wherein said sensing comprises arranging a pyrometric element in spaced relationship above said wafer.

13. A method as claimed in claim 10, wherein said energy supply is transmitted to said hot plate so as to uniformly heat the surface of said hot plate supporting said wafer.

14. A method as claimed in claim 10, wherein said hot plate has a surface for supporting said wafer divided into a plurality of zones, said energy being supplied to heating elements in each of said zones so as to impart a predetermined heating pattern to the surface of said hot plate.

15. A method as claimed in claim 14, wherein said zones in said hot plate comprise individually thermally-controllable heating areas in the surface of said hot plate.

16. A method as claimed in claim 15, wherein said zones are heated in correlation with temperatures sensed on said wafer so as to adjust the hot plate temperatures to a specified temperature profile.

17. A method as claimed in claim 10, wherein said wafer temperature is controlled during post exposure baking of the wafer employed in the fabrication of semiconductor devices and to control the image sizes of integrated circuits on said wafer.

18. A method as claimed in claim 10, wherein a monitor is operatively connected to said hot plate for in situ visual monitoring of hot plate surface temperatures so as to ensure that the hot plate arrangement is controlled to the specified temperature profile.

* * * * *

UNITED STATES PATENT AND TRADEMARK OFFICE
CERTIFICATE OF CORRECTION

PATENT NO. : 6,100,506
DATED : August 8, 2000
INVENTOR(S) : James J. Colelli, et al.

It is certified that error appears in the above-identified patent and that said Letters Patent are hereby corrected as shown below:

On The Title Page, [56] References Cited, OTHER

PUBLICATIONS: Insert --IBM Technical Disclosure Bulletin, W.M.

Holber, et al., "WAVELENGTH MODULATED INTERFEROMETRIC THERMOMETRY

FOR MEASUREMENT OF NON-MONOTONIC TEMPERATURE CHANGE", Vol. 34,

No. 5, October 1991, pgs. 350-353.--

Signed and Sealed this

Seventeenth Day of April, 2001

*Attest:*

NICHOLAS P. GODICI

*Attesting Officer*   Acting Director of the United States Patent and Trademark Office